United States Patent [19]

Nelson et al.

[11] 4,051,440
[45] Sept. 27, 1977

[54] PHASE LOCKED DEMODULATOR

[75] Inventors: Larry A. Nelson, Hillsboro; Philip Stephen Crosby, Beaverton, both of Oreg.

[73] Assignee: Tektronix, Inc., Beaverton, Oreg.

[21] Appl. No.: 663,663

[22] Filed: Mar. 4, 1976

Related U.S. Application Data

[62] Division of Ser. No. 504,415, Sept. 9, 1974, abandoned, which is a division of Ser. No. 360,519, May 15, 1973, Pat. No. 3,863,254.

[51] Int. Cl.$^2$ .................. H03B 3/04; H03D 13/00; H03D 3/00; H03K 9/06
[52] U.S. Cl. .................. 328/134; 307/232; 307/295; 329/111; 329/122
[58] Field of Search ........ 328/133, 134, 155, 109–110; 307/232, 295; 329/110, 111, 122

[56] References Cited

U.S. PATENT DOCUMENTS

| | | | |
|---|---|---|---|
| 2,794,123 | 5/1957 | Younker | 328/55 |
| 2,931,981 | 4/1960 | Schabauer | 328/55 |
| 3,164,777 | 1/1965 | Guanella | 328/134 |
| 3,600,692 | 8/1971 | McGee | 328/134 |
| 3,813,604 | 5/1974 | Denoncourt | 328/133 |

*Primary Examiner*—Stanley D. Miller, Jr.
*Attorney, Agent, or Firm*—Kenneth M. Durk

[57] ABSTRACT

A phase detector provides a voltage output which depends upon the phase difference between a limited input signal and a reference signal. The phase detector increases the dynamic range of the resultant phase locked loop. An embodiment which illustrates the capability of the design is a SECAM color difference signal demodulator.

4 Claims, 6 Drawing Figures

PHASE LOCKED DEMODULATOR

CROSS REFERENCE TO RELATED APPLICATION

This is a division of application Ser. No. 504,415 filed Sept. 9, 1974, now abandoned, which is a division of application Ser. No. 360,519 filed May 15, 1973, now U.S. Pat. No. 3,863,254.

BRIEF SUMMARY OF INVENTION

A phase locked demodulator is provided which includes means for providing a voltage output which depends upon the phase difference between a limited input signal and a variable reference signal. The demodulator includes digital means to supply outputs which are proportional to the instantaneous frequency of the limited input signal.

IN THE DRAWINGS

FIG. 1 is a schematic drawing of the demodulator according to the present invention, and is the same as FIG. 6 in the referenced U.S. Pat. No. 3,863,264;

FIG. 2 (a–c) is a voltage vs. time graph of the operation of the demodulator in FIG. 1 embodiment, and is the same as FIG. 7 in the referenced U.S. Pat. No. 3,863,264; and FIG. 3 is another embodiment of the demodulator according to the present invention, and is the same as FIG. 8 in the referenced U.S. Pat. No. 3,863,264.

DETAILED DESCRIPTION OF INVENTION

Figure 1:
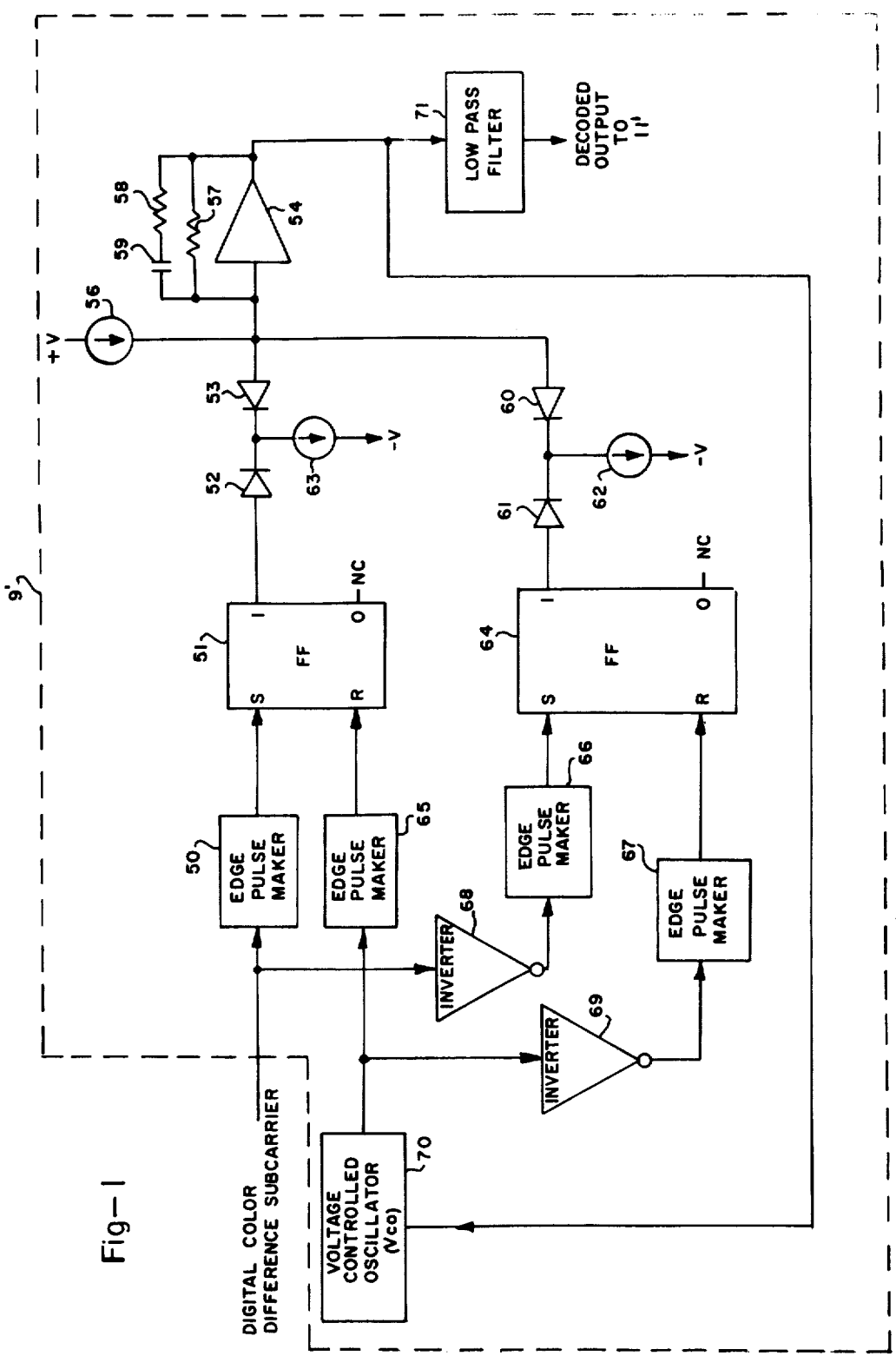
Figure 2:
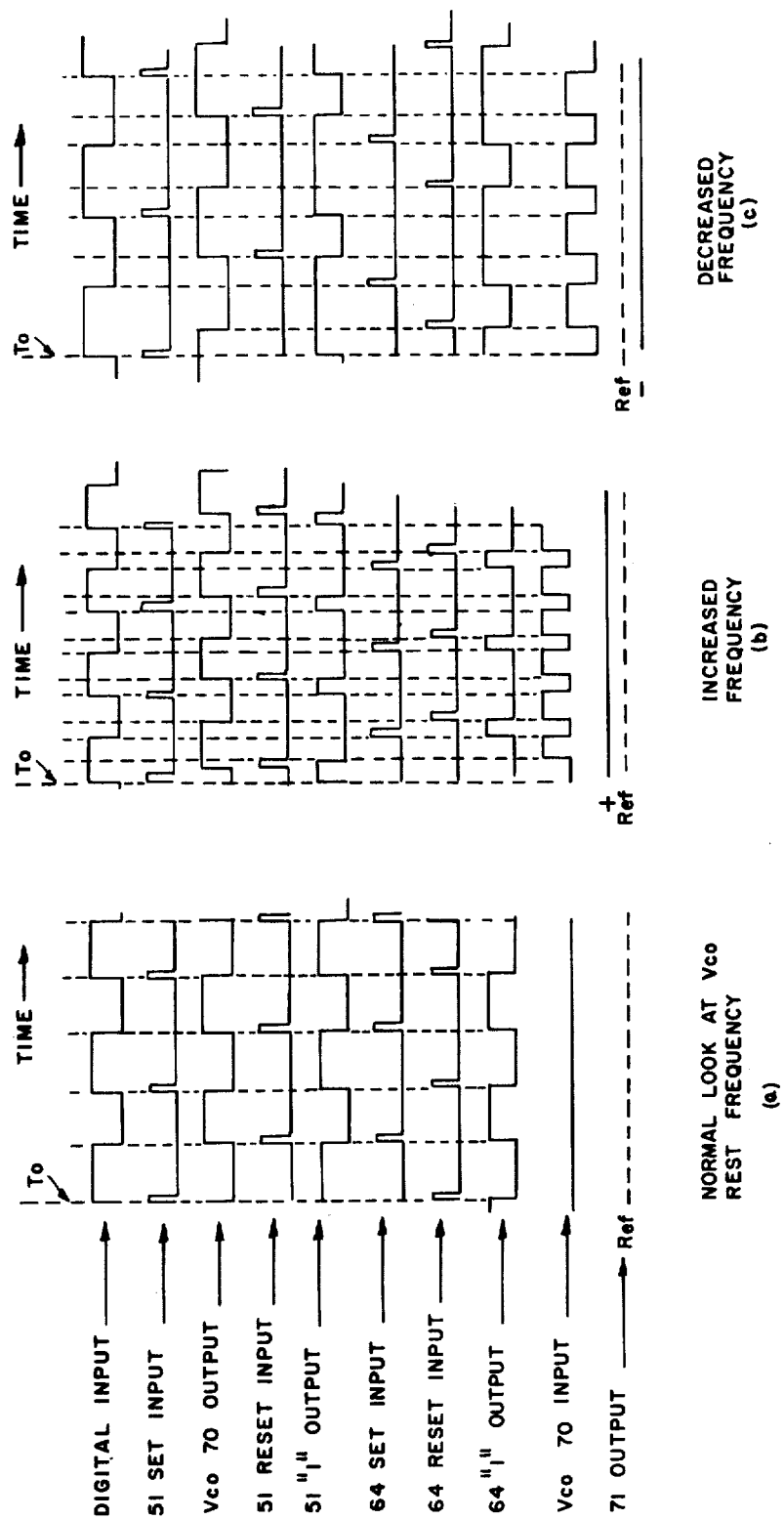
Figure 3:
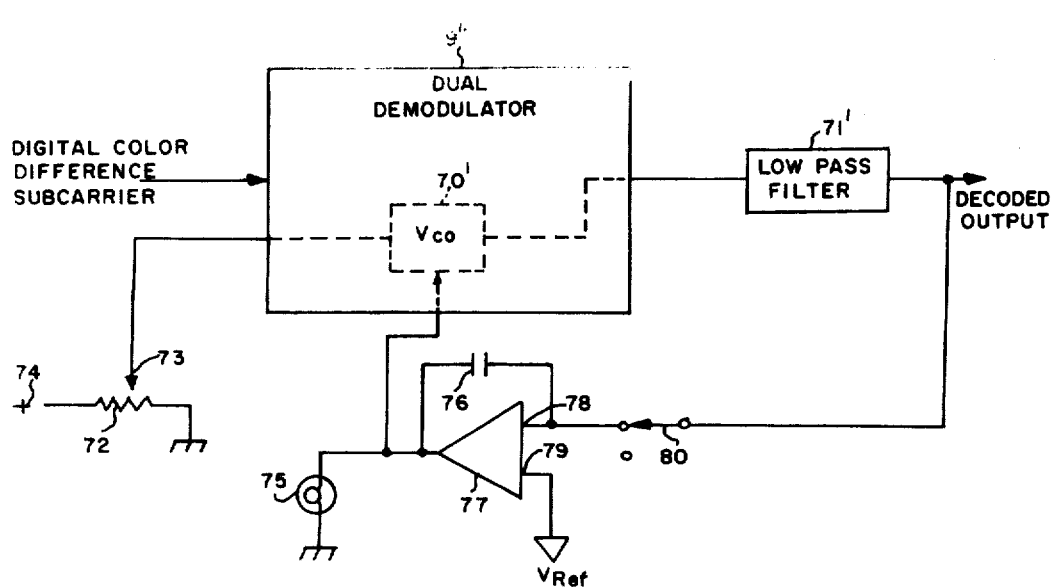

The essential material necessary to adequately disclose the invention and support the appended claims is hereby incorporated by reference to U.S. Pat. No. 3,863,264 and in particular to pages 7, 8 and 9 thereof.

The invention is claimed in accordance with the following:

1. A circuit for providing a voltage output which depends on the phase difference between a digital input signal corresponding to a frequency modulated signal and a voltage controlled oscillator, comprising:

edge pulse making means for producing pulses corresponding to the positive transitions of said input signal;

inverting means for inverting said input signal;

second edge pulse making means for producing pulses corresponding to the negative transitions of said input signal;

digital means defining a set-reset flip-flop having its set input connected fto the output of said first edge pulse making means to produce an output thereoutof which directly corresponds to positive excursions of said digital input signal;

second digital means defining a set-reset flip-flop having its set input connected to the output of said second edge pulse making means to produce an output thereoutof which directly corresponds to negative excursions of said digital input signal;

switch means defining diodes in pairs and having separate current sources connected to the outputs of said first and second digital means to route a comparison current in accordance with the output of said first and second digital means;

amplifier means defining an operational amplifier connected to the output of said switch means for amplifying said comparison of said switch means;

voltage controlled oscillator means connected to the output of said amplifier means to provide an output thereoutof having two stable states, said states being 180° out of phase with said digital input signal in accordance with said amplified comparison signal;

third edge pulse making means connected to the output of said voltage controlled oscillator and the reset input of said first set-reset flip-flop means for producing pulses thereoutof which correspond to the positive excursions of said voltages controlled oscillator output square wave to change the state of said first flip-flop output;

second inverter means connected to the output of said voltage controlled oscillator to provide thereoutof an output signal 180° of phase with said voltage controlled oscillator output; and fourth edge pulse making means connected between the output of said second inverter means and the reset input of said second set-reset flip-flop means for producing pulses thereoutof which correspond to the negative excursions of said voltage controlled oscillator output square wave to change the state of said second flip-flop output.

2. The circuit according to claim 1 further comprising:

low pass filter means also connected to the output of said amplifier means for providing the voltage output of said circuit;

second switch means connected to the output of said low pass filter;

second amplifier means having a first input connected to said second switch means and having its output connected to said voltage controlled oscillator and having its second input connected to a reference voltage;

indicator means also connected to the output of said second amplifier; and variable resistance means connected to said voltage controlled oscillator means for changing the output of said oscillator in accordance with the difference of voltage between the first and second inputs of said second amplifier.

3. The circuit according to claim 2 wherein said indicator means defines an indicator of drift.

4. The circuit according to claim 2 wherein said circuit defines a calibration circuit.

* * * * *